(12) United States Patent
Iny

(10) Patent No.: US 6,711,028 B2
(45) Date of Patent: Mar. 23, 2004

(54) SWITCHING DEVICE AND A METHOD FOR THE CONFIGURATION THEREOF

(75) Inventor: Ofer Iny, Woodland Hills, CA (US)

(73) Assignee: Dune Networks, Agoura, CA (US)

( * ) Notice: Subject to any disclaimer, the term of this patent is extended or adjusted under 35 U.S.C. 154(b) by 26 days.

(21) Appl. No.: 10/066,122

(22) Filed: Jan. 30, 2002

(65) Prior Publication Data

US 2003/0142483 A1 Jul. 31, 2003

(51) Int. Cl.[7] ................................................. H05K 7/10
(52) U.S. Cl. ....................... 361/788; 361/785; 361/803
(58) Field of Search ................................ 361/785, 788, 361/790, 803

(56) References Cited

U.S. PATENT DOCUMENTS

| | | | | | |
|---|---|---|---|---|---|
| 4,472,765 A | * | 9/1984 | Hughes | ...................... | 361/791 |
| 4,703,394 A | * | 10/1987 | Petit et al. | ................... | 361/790 |
| 5,122,691 A | * | 6/1992 | Balakrishnan | ................ | 326/86 |
| 5,167,511 A | * | 12/1992 | Krajewski et al. | ............. | 439/61 |
| 5,296,748 A | * | 3/1994 | Wicklund et al. | ............ | 327/565 |
| 5,870,528 A | * | 2/1999 | Fukuda | ........................ | 700/245 |
| 5,887,158 A | * | 3/1999 | Sample et al. | ................. | 716/15 |
| 5,991,163 A | * | 11/1999 | Marconi et al. | ............. | 361/788 |
| 6,163,464 A | * | 12/2000 | Ishibashi et al. | ............. | 361/788 |
| 6,462,957 B1 | * | 10/2002 | Kwong et al. | .............. | 361/796 |
| 6,528,737 B1 | * | 3/2003 | Kwong et al. | .............. | 174/262 |
| 6,538,899 B1 | * | 3/2003 | Krishnamurthi et al. | .... | 361/788 |
| 6,608,762 B2 | * | 8/2003 | Patriche | ...................... | 361/788 |
| 2002/0181215 A1 | * | 12/2002 | Guenthner | .................. | 361/784 |

* cited by examiner

Primary Examiner—John B. Vigushin
(74) Attorney, Agent, or Firm—Sawyer Law Group LLP (57) ABSTRACT

A switching device and a method for the configuration thereof is disclosed. A first aspect of the present invention comprises a switching device. The switching device comprises at least one line card and at least one switching card. The device includes a mid-plane coupled to the at least one line card and the at least one switching card. The A second aspect of the invention comprises a method for configuring a switching device. The method for configuring a switching device comprises providing a mid-plane, and providing at least one switching card and at least one line card on the mid-plane. The at least one switching card and the at least one line card are perpendicular to each other.

4 Claims, 8 Drawing Sheets

SWITCHING DEVICE AND A METHOD FOR THE CONFIGURATION THEREOF

FIELD OF THE INVENTION

The present invention relates generally to data networking systems and more specifically to a network switching device and a method of configuration thereof.

BACKGROUND OF THE INVENTION

Due to the proliferation of local area networks (LAN's), needs have developed for more powerful tools to manage such LAN's as they increase in complexity and size. Modern data networking systems rely on packet transport networks to interconnect the various network elements. Packet transport networks typically incorporate packet switching devices to route the data packets through the network from a source to a destination.

Figure 1:
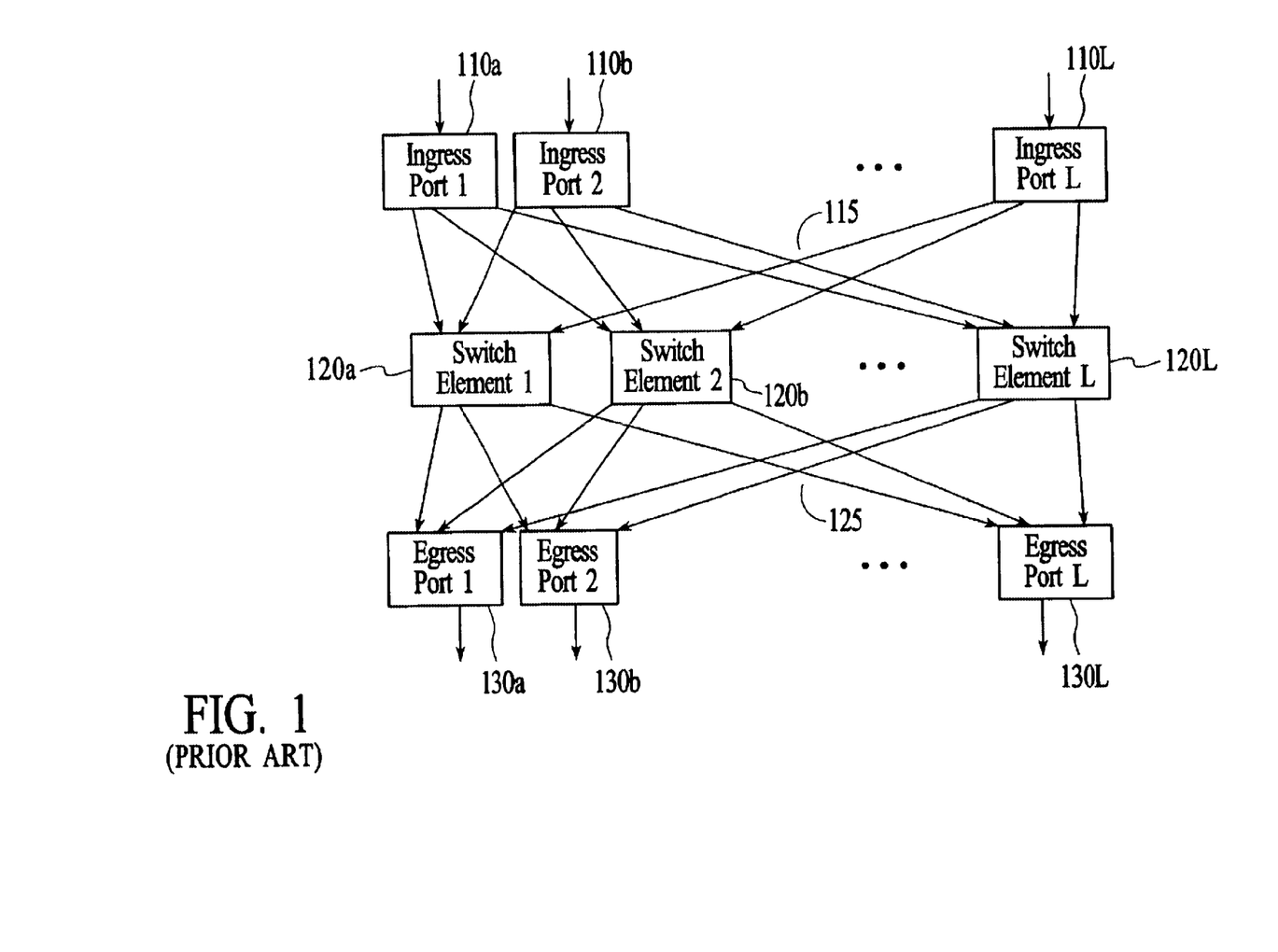
FIG. 1 shows a conventional switching device.

Please refer now to FIG. 1. FIG. 1 shows a conventional switching device 100. The device 100 comprises a plurality of ingress ports 110(a–l), a plurality of switch elements 120(a–l), and a plurality of egress ports 130(a–l). Also shown are the connections 115, 125 between the ports 110(a–l), 130(a–l) and the switch elements 120(a–l), respectively. In general, the ingress/egress functionality of the device 100 may be implemented via a plurality of line cards and the switching functionality may be implemented via a plurality of switching cards. For example, the ingress/egress ports 110(a–l), 130(a–l) may be packaged on N line cards and the switching elements 120(a–l) may be packaged on M switching cards whereby the line cards and the switching cards are connected by an order of (N*M) interconnects. In a typical line card/switching card configuration, the line cards and switching over cards are coupled to a backplane in a substantially parallel fashion.

Figure 1A:
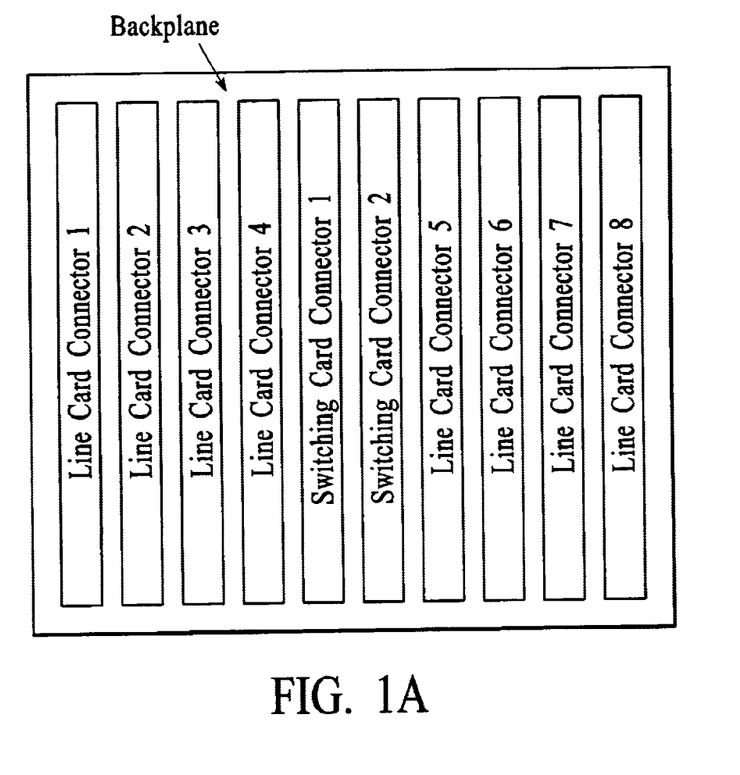
FIG. 1A shows a front view of one conventional design where line-cards/switching-cards are interconnected through a backplane.

It is important in the line card/switching card configuration, that the signals between the line cards and switch cards be as short as possible and have a minimum crossover of the electrical coupling. FIG. 1A shows a front view of one conventional design where line-cards/switching-cards are interconnected through a backplane. Assuming that the interconnections, between line cards and switching cards, depicted in FIG. 1 are required, it is easy to imagine the signal routing requirements on the backplane.

In a large scale, high speed switching device, this is achieved by increasing the number of signal layers on a backplane and selecting proper card and connector orientations. However, there are practical limits to the number of signal layers and signal density that can be implemented on the backplane, given the parallel nature of the cards. This results in a limit on the number of signals and cards that can be interconnected given a particular method.

Accordingly, what is needed is a device and an interconnection scheme that is not limited by the above referenced constraints. The system should be somewhat simple, cost effective and capable of being easily adapted into existing technology. The present invention addresses such a need.

SUMMARY OF THE INVENTION

A switching device and a method for the configuration thereof is disclosed. A first aspect of the present invention comprises a switching device. The switching device comprises at least one line card and at least one switching card. The device includes a mid-plane coupled to the at least one line card and the at least one switching card. The at least one line card and the at least one switching card are perpendicular to each other.

A second aspect of the invention comprises a method for configuring a switching device. The method for configuring a switching device comprises providing a mid-plane, and providing at least one switching card and at least one line card on the mid-plane. The at least one switching card and the at least one line card are perpendicular to each other.

Through the use of the present invention, line cards and/or switch cards can be connected to a mid-plane via a plurality of connectors wherein the line cards and switching cards are perpendicular to each other. By utilizing this configuration, the signals from the line card to the switching cards no longer need to cross each other. Additionally, the interconnections are short and can be implemented in a few layers. This results in the use of smaller interconnection boards that contain substantially less layers, thereby reducing the overall production costs, increasing the signal integrity of the back plane and overall reliability of the device.

DETAILED DESCRIPTION

The present invention relates to a switching device and a method for the configuration thereof. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown, but is to be accorded the widest scope consistent with the principles and features described herein.

The present invention is presented in the context of a preferred embodiment. The preferred embodiment of the present invention is a switching device and a method for the configuration thereof. The present invention allows line cards and/or switching cards to connect to a mid-plane. The line cards and switching cards are perpendicular to each other and to the mid-plane. By utilizing this configuration, the need for the signals from the line card to the switching cards no longer need to cross each other.

Figure 2:
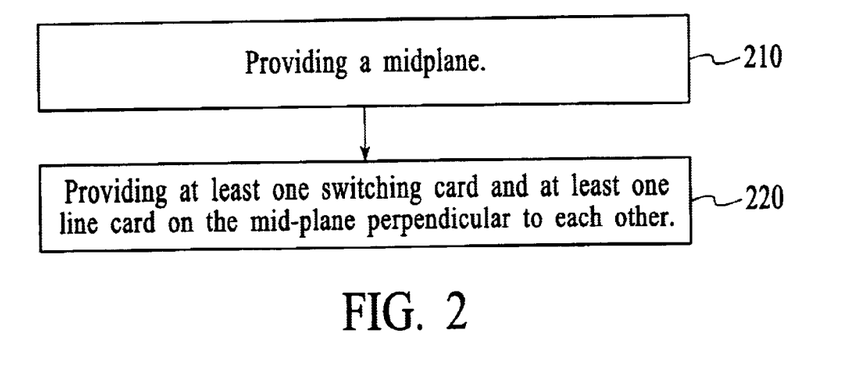
FIG. 2 shows a simple flowchart of a method in accordance with the present invention.

FIG. 2 is a simple flowchart of the method in accordance with the present invention. First, a mid-plane is provided, via step 210. Next, at least one switching card and at least one line card on the mid-plane are perpendicular to each other, via step 220.

In so doing, the distance between connections of the line cards and switching cards is substantially minimized. In addition, in a preferred embodiment, one of the at least one line card and at least one switching care has one continuous mid-plane connector and the other of the at least one line card and at least one switching card includes a mid-plane connector which is broken up into a plurality of mid-plane subconnectors.

In accordance with the present invention, the line cards, the switching cards and the mid-plane preferably reside on three mutually orthogonal planes. In a preferred embodiment, the line cards are aligned in a parallel fashion and are connected on one side of the mid-plane via a plurality of connectors. The switching cards are also aligned in a parallel fashion and are each connected to the opposite side of the mid-plane via a single connector.

For a more detailed description of the details of the present invention, refer now to the following description in conjunction with the accompanying figures.

Figure 3:
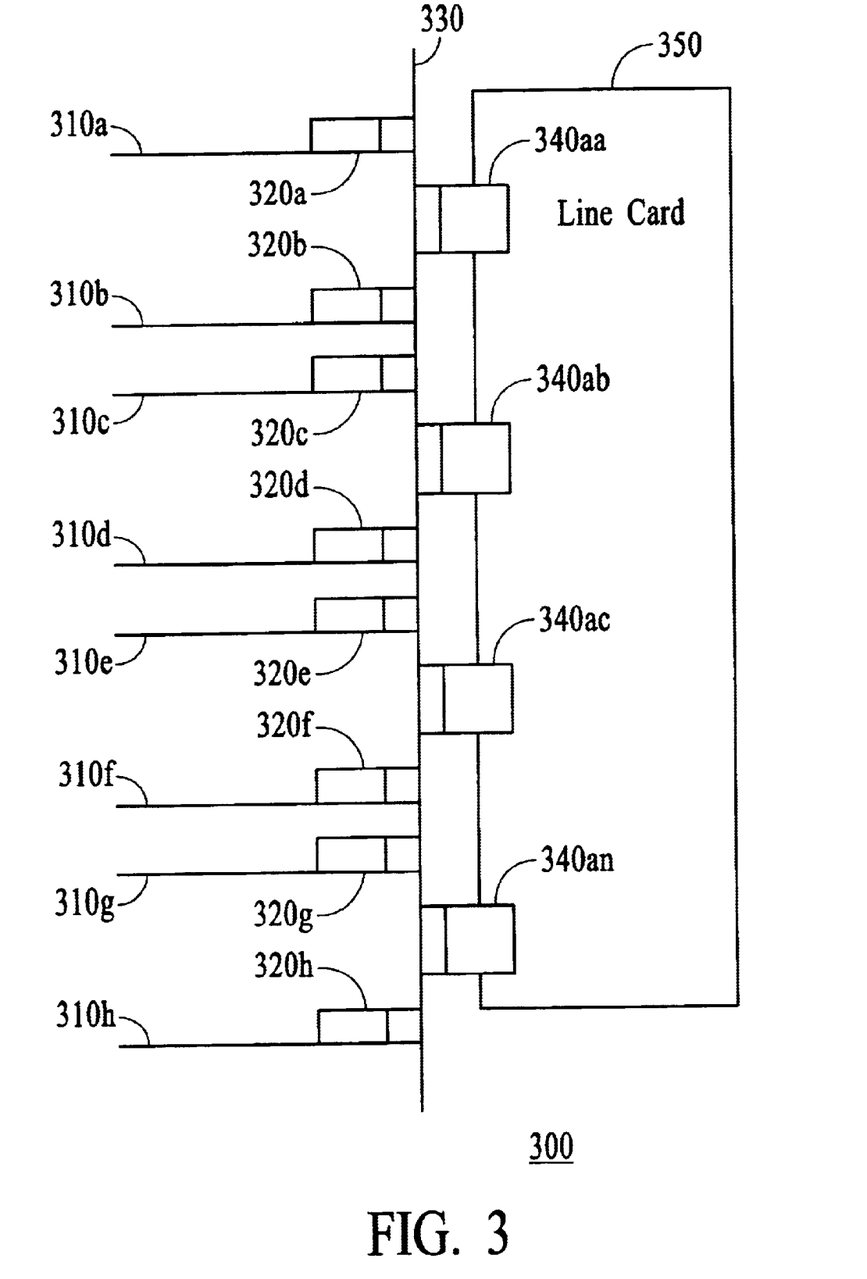
FIG. 3 is a side view of a switching device in accordance with the present invention.

FIG. 3 is a side view of a switching device 300 in accordance with the present invention. The switching device 300 comprises a plurality of switching cards 310 (*a–h*), a mid-plane 330, and a plurality of line cards 350 (*a–h*). In this view, only line card 350*a* is shown. As can be seen, the plurality of switching cards 310(*a–h*), the mid-plane 330 and the at least one line cards 350 reside on three mutually orthogonal planes, i.e. the plurality of switching cards 310 (*a–h*), the mid-plane 330 and the at least one line card 350 are perpendicular to each other.

Each of the switching cards 310*a*–310*h* includes a switching card connector and each of the line cards includes a line card connector. In this embodiment, each of the plurality of switching cards 310 (*a–h*) are coupled to the mid-plane 330 via a single switching card connector, e.g. switching card 310*a* is connected to the mid-plane 330, via switching card connector 320*a*, switching card 310*b* is connected to the mid-plane 330 via switching card connector 320*b*, etc. Each of the line cards 350, however, is coupled to the mid-plane 330 via the plurality of line card subconnectors 340*aa*–340*nn*.

Figure 4:
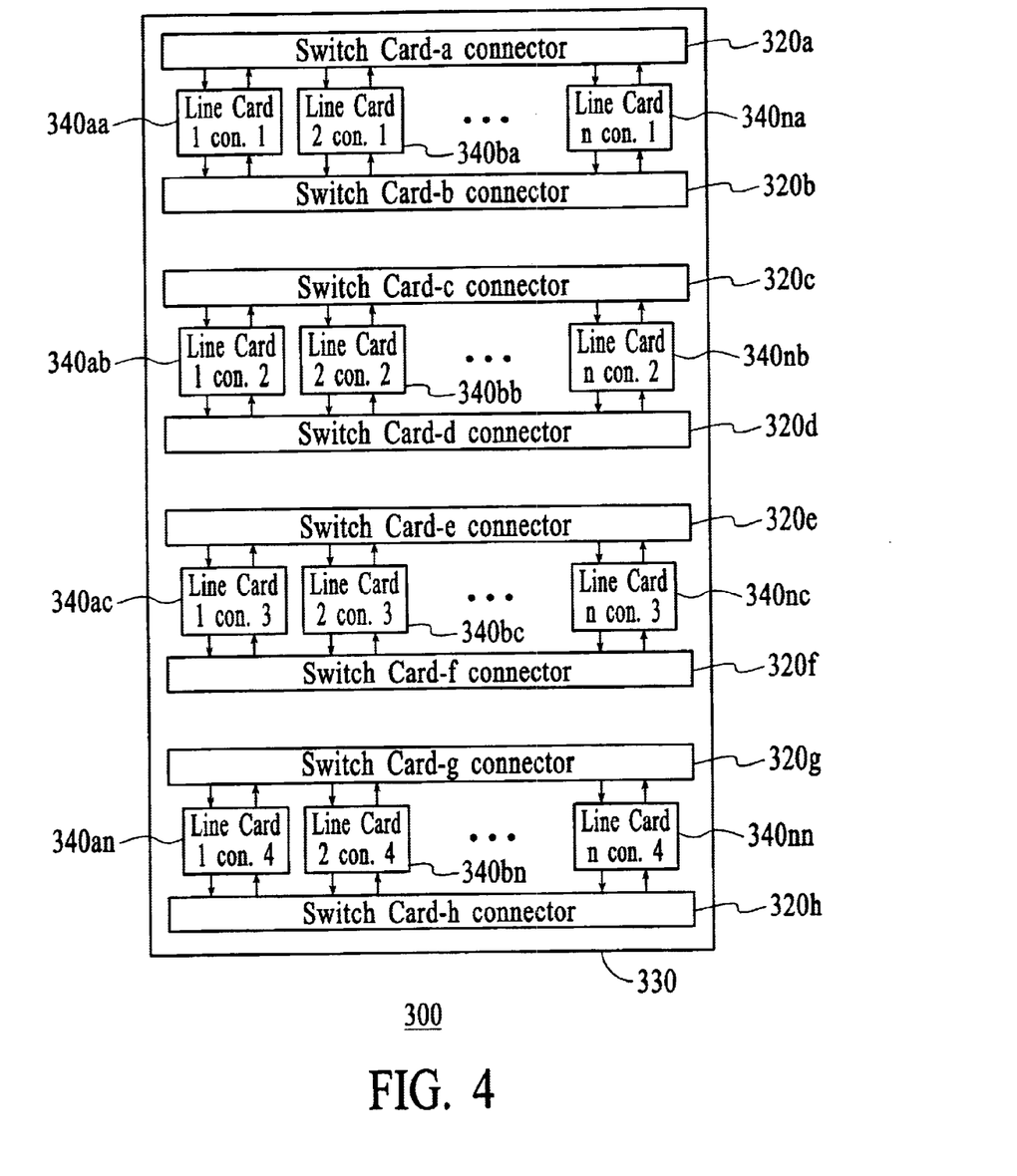
FIG. 4 shows a front view of the switching device in accordance with the present invention.

FIG. 4 shows a front view of the switching device 300 in accordance with the present invention. In the example system, the number of mid-plane subconnectors of the line cards is one-half the number of switching card; each subconnector connects a line card to two switching cards. In one particular system there are 8 interconnecting switching cards, each with 2 switching elements, and 16 line cards, each with two or eight ingress/egress ports. Each line card has 4 mid-plane connectors. Signals on the line card that need to go to the switching cards are distributed to the four connectors. Signals that need to connect to switching card 1 are routed to connector 1 upper side, signals that need to connect to switching card 2 are routed to connector 1 lower side. This scheme continues until finally signals that need to connect to switching card 8 are routed to connector 4 left side.

In the general case, the switching card and the line card are first given some numbering scheme. Within the line card, the line card to switching card connectivity is spread, preferably linearly, across the board edge according to the switching card numbers, and is lumped into o(M) spaced-apart connectors. Each connector establishes connection to a small fixed number of switching elements, e.g. 2. As before mentioned, the switching device 300 (FIG. 3) comprises a plurality of single switching card connectors 320*a*–320*h* and a plurality of line card subconnectors 340*aa*–340*nn*. It should be noted that the switching card connectors 320*a*–320*h* and the line card subconnectors 340*aa*–340*nn* are on opposite sides of the mid-plane 330. The respective arrows in FIG. 4 show the routing of the signals between the respective switching card connectors 320*a*–320*h* and line card subconnectors 320*aa*–320*nn* of this embodiment.

Accordingly, the interconnection of the line cards and switching cards do not need to cross each other. In addition, the interconnections are short, e.g. from the mid section of the line connector to the single closest switching card connector, and can be implemented in a few signal layers. This results in the use of smaller interconnection boards that contain substantially, less layers, thereby reducing the overall production costs. The line card connectors are oriented perpendicularly to the switching cards connectors. In one implementation, the line cards are aligned vertically and the switching cards are aligned horizontally. The line cards subconnectors are interleaved between the switching cards connectors. The distance between the subconnectors on a line card is such that two switching cards can fit in-between neighboring line card subconnectors.

Although the above-described embodiment discloses the connection of the switching cards to the mid-plane via a single connector and the connection of the line cards to the mid-plane via a plurality of connectors, one of ordinary skill in the art will readily recognize that a variety of different implementations could be employed while remaining within the spirit and scope of the present invention. For example, the switching cards could be connected to the mid-plane via a plurality of connectors while the line card is connected via a single connector, both the switching cards and line cards could be connected to the mid-plane via a plurality of connectors, etc. Additionally, the number of line cards and switching cards, as well as the number of respective connectors, could vary, based on the particular implementation.

Figure 5:
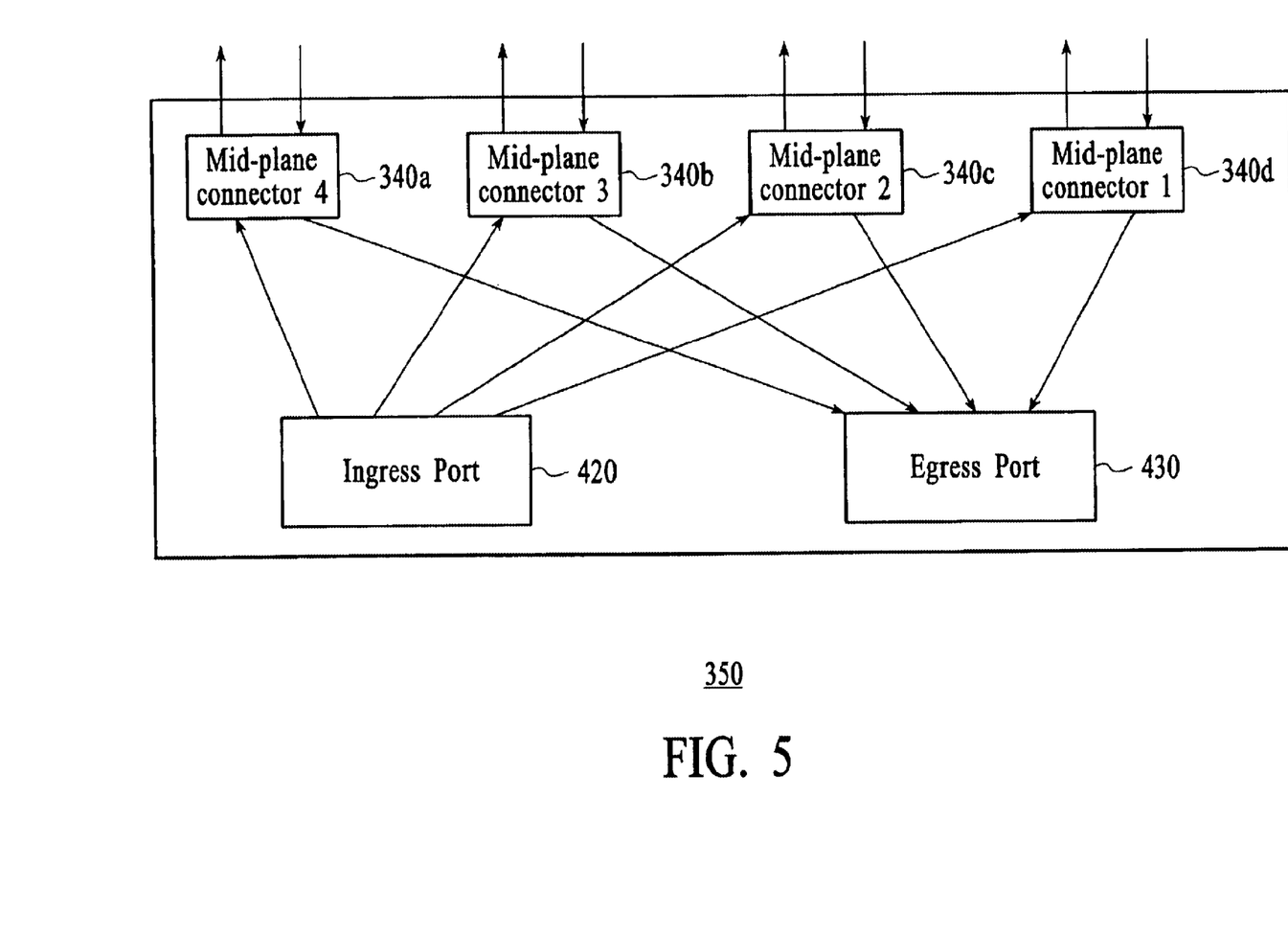
FIG. 5 shows an embodiment of a line card in accordance with the present invention.

For a more detailed description of the line cards and switching cards, refer now to the following. FIG. 5 shows an embodiment of a line card 350 in accordance with the present invention. In this embodiment, the line card 350 comprises a plurality of mid-plane subconnectors 340*a*–340*d*, an ingress port 420, and an egress port 430. Referring back to FIG. 3, the plurality of mid-plane subconnectors 340*aa*–340*nn* are connected to the mid-plane 330. Signals from the ingress and egress ports 420 and 430 are distributed to the mid-plane 330, where they are then sent to an associated switching card.

Figure 6:
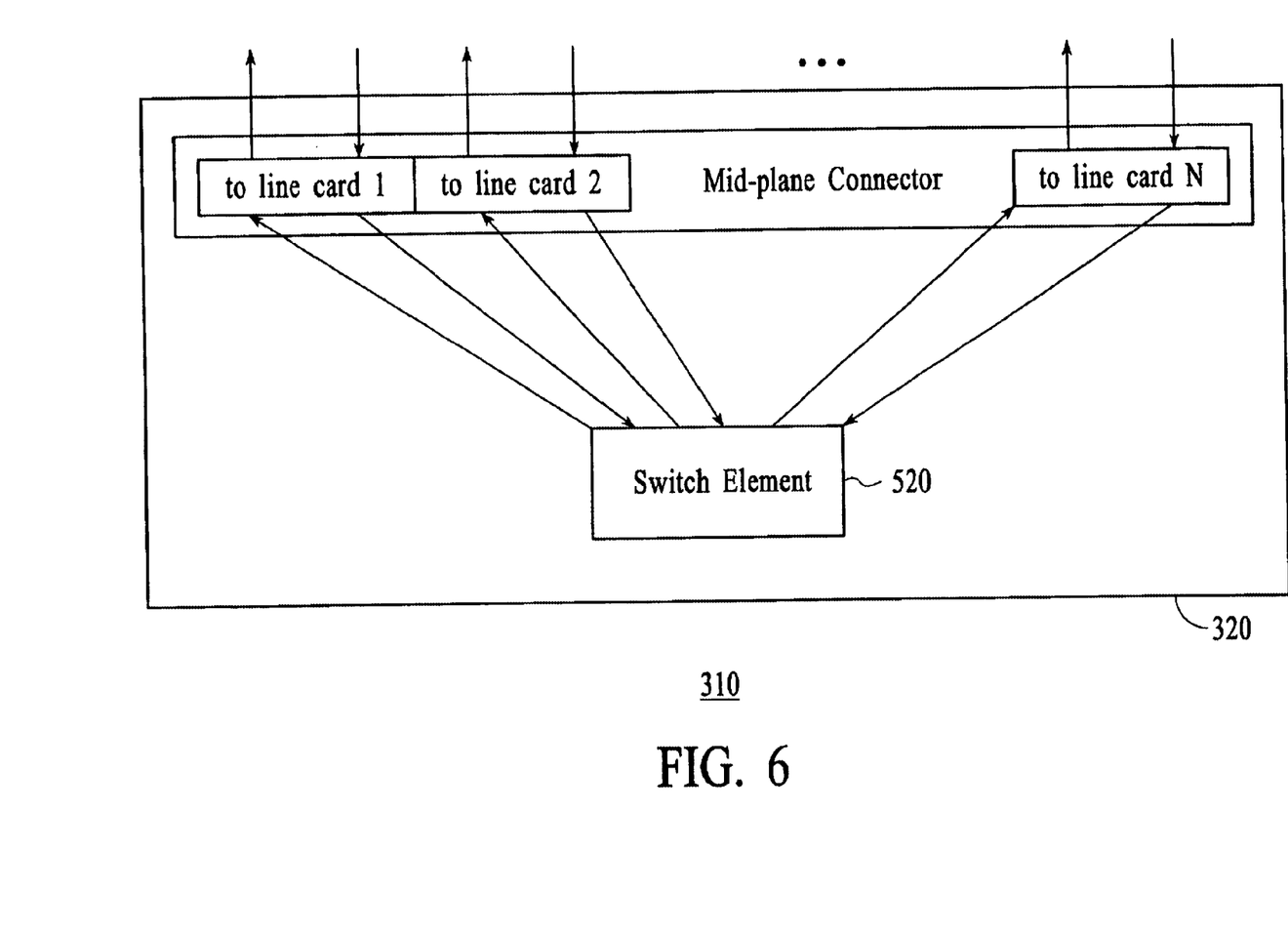
FIG. 6 is an embodiment of a switching card in accordance with the present invention.

FIG. 6 is an embodiment of a switching card 310 in accordance with the present invention. In this embodiment, the switching card 310 comprises a single mid-plane connector 320 and a switch element 520. The switching card 310 is connected to the mid-plane 330 via the mid-plane connector 320. For example, referring back to FIGS. 3 and 4, switching card 310*a* is connected to the mid-plane 330 via it's respective mid-plane connector 320*a*, switching card 310*b* is connected to the mid-plane 330 via it's respective mid-plane connector 320*b*, etc. In general, signals on the switching card 310 (FIG. 6) to line card 350*a* are routed to the rightmost part of the mid-plane connector 320, signals that need to go to line card 350*b* are routed to the left of the line card 350*a* signals, etc. Finally, signals to the last line card 350*n* are routed to the leftmost part of the mid-plane connector 320.

Again, referring back to FIGS. 3 and 4, the plurality of line cards 350 are aligned vertically and the plurality of switching cards 310(*a–h*) are aligned horizontally. The plurality of line card subconnectors 340aa–340nn are interleaved between the plurality of switching card connectors 320a–320h. Each plurality of line card subconnectors 340aa–340nn establishes a connection with a small fixed number of switching cards. In the preferred embodiment, each line card subconnector 340 establishes a connection with two switching cards, e.g. line card connector 340aa establishes a connection with switching cards 310a and 310b, line card connector 340ab establishes a connection with switching cards 310c and 310d, etc. Accordingly, the distance between the plurality of line card subconnectors 340aa–340nn is such that two switching cards can fit in-between neighboring line card connectors.

Figure 7:
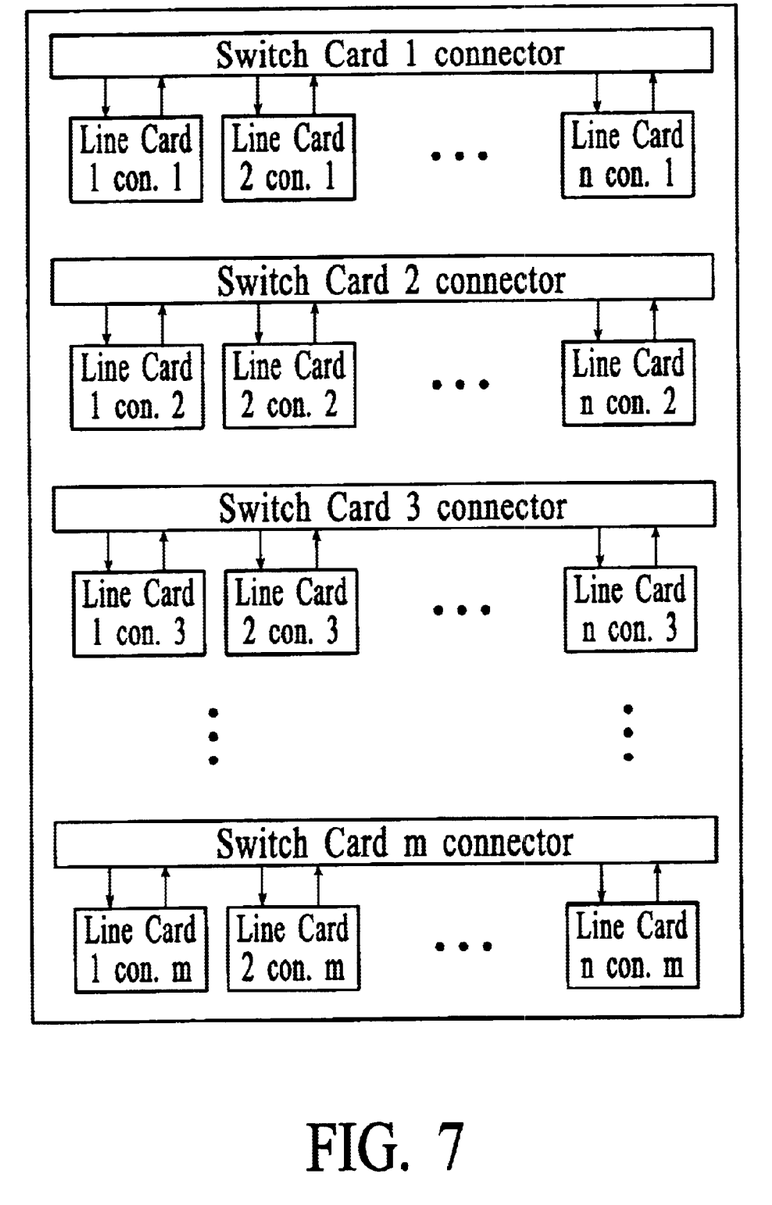
FIGS. 7 and 8 are alternative embodiments of switching devices in accordance with the present invention.
Figure 8:
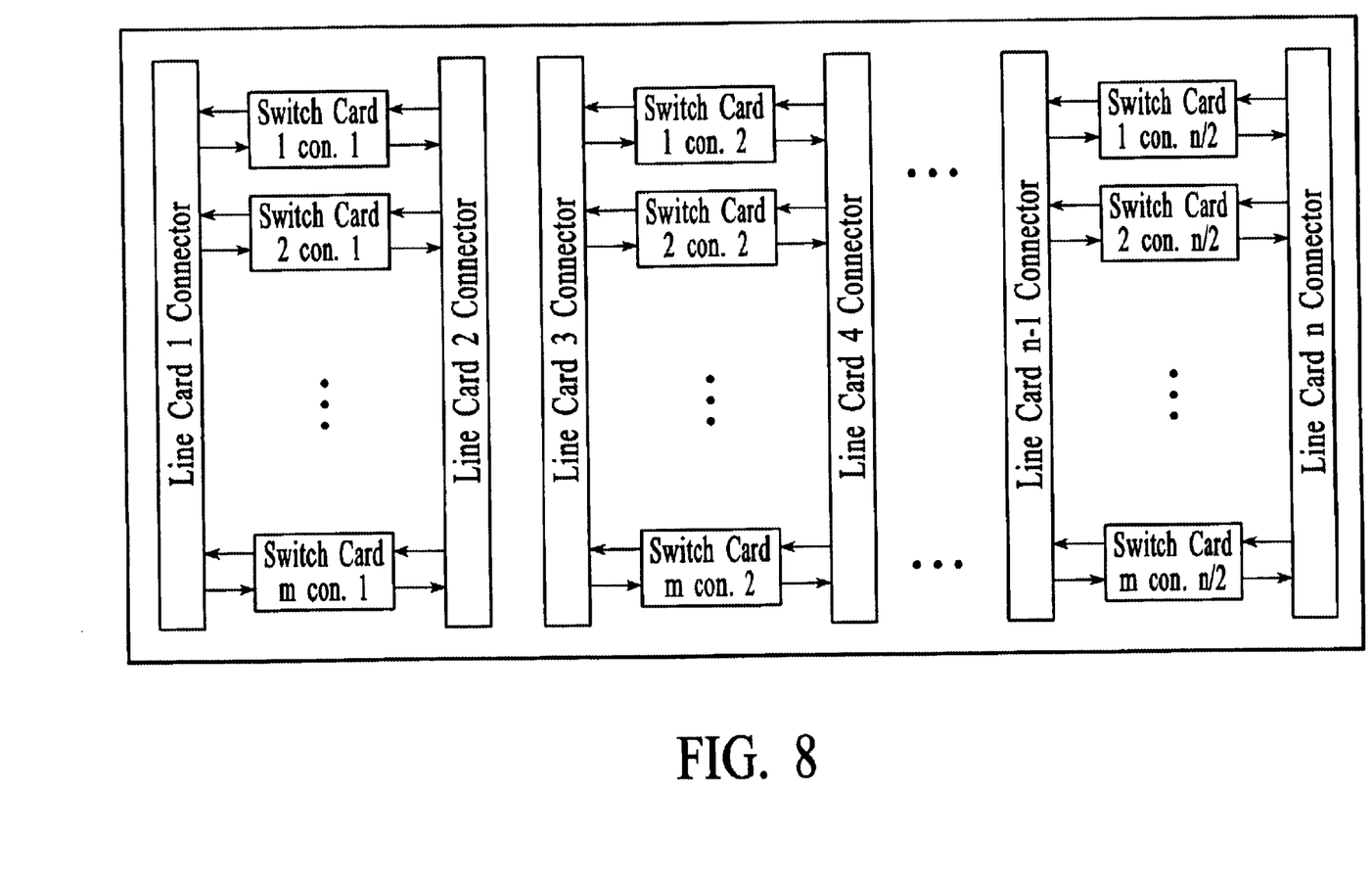

It is noted that the requirement that the line card connector be broken into physically separate pieces (sections) and the switch card connector not broken may be swapped in a different implementation, or both line card and switching cards connectors may be broken into sections. Two of these alternatives are depicted in FIG. 7 and FIG. 8. The number of line cards and switch cards may vary and the number of connector sections of line card or switch card may vary. In all cases, the invention of a perpendicular and interleaved orientation of the line cards to the switch card and mid-plane design enables the elimination of crossing signals and reduced length of the interconnects.

A switching device and a method for the configuration thereof is disclosed. The present invention allows line cards and/or switch cards to connect to a mid-plane via a plurality of connectors wherein the line cards and switching cards are perpendicular to each other. By utilizing this configuration, the need for the signals from the line card to the switching cards no longer need to cross each other. Additionally, the interconnections are short and can be implemented in a few layers. This results in the use of smaller interconnection boards that contain substantially less layers, thereby reducing the overall production costs.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A switching device comprising;
   at least one line card;
   at least one switching card, wherein the at least one switching card comprises a switch element and a second mid-plane connector coupled to the switch element; and
   a mid-plane coupled to the at least one line card and the at least one switching card wherein the at least one line card and the at least one switching card are perpendicular to each other, wherein the at least one line card and the at least one switching card are perpendicular to and on opposite sides of the mid-plane, wherein the at least one card comprises an ingress port and an egress port, and a first mid-plane connector coupled to the ingress port and egress port, wherein the first mid-plane connector comprises a plurality of mid-plane subconnectors, and wherein the second mid-plane connector comprises a single mid-plane connector.

2. A switching device comprising:
   at least one line card:
   at least one switching card; and
   a mid-plane coupled to the at least one line card and the at least one switching card wherein the at least one line card and the at least one switching card are perpendicular to each other, wherein the at least one line card and the at least one switching card are perpendicular to and on opposite sides of the mid-plane, wherein the at least one line card comprises an ingress port and an egress port, and a first mid-plane connector coupled to the ingress port and egress port, wherein the at least one switching card comprises a switch element and a second mid-plane connector coupled to the switch element; wherein the first mid-plane connector comprises a single mid-plane connector, and wherein the second mid-plane connector comprises plurality of mid-plane subconnectors.

3. A method for configuring a switching device, the method comprising the steps of:
   providing a mid-plane; and
   providing at least one switching card and at least one line card on the mid-plane, wherein the at least one switching card and the at least one line card are perpendicular to each other, wherein the at least one line card and the at least one switching card are perpendicular to and on opposite sides of the mid-plane, wherein the at least one line card comprises an ingress port and an egress port, and a first mid-plane connector coupled to the ingress port and egress port, wherein the at least one switching card comprises a switch element and a second mid-plane connector coupled to the switch element, wherein the first mid-plane connector comprises a plurality of mid-plane subconnectors, and wherein the second mid-plane connector comprises a single mid-plane connector.

4. A method for configuring a switching device, the method comprising the steps of:
   providing a mid-plane; and
   providing at least one switching card and at least one line card on the mid-plane, wherein the at least one switching card and the at least one line card are perpendicular to each other; wherein the at least one line card and the at least one switching card are perpendicular to and on opposite sides of the mid-plane; wherein the at least one line card comprises an ingress port and an egress port, and a first mid-plane connector coupled to the ingress port and egress port; wherein the at least one switching card comprises a switch element and a second mid-plane connector coupled to the switch element; and wherein the first mid-plane connector comprises a single mid-plane connector, and wherein the second mid-plane connector comprises a plurality of mid-plane connectors.

* * * * *